United States Patent
Koike

(10) Patent No.: US 6,741,481 B2
(45) Date of Patent: May 25, 2004

(54) STRUCTURE FOR CIRCUIT BOARD ATTACHING PORTION

(75) Inventor: Hitoshi Koike, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 0 days.

(21) Appl. No.: 10/254,847

(22) Filed: Sep. 26, 2002

(65) Prior Publication Data

US 2003/0072143 A1 Apr. 17, 2003

(30) Foreign Application Priority Data

Sep. 27, 2001 (JP) .................................. P. 2001-296200

(51) Int. Cl.[7] ................................................ H05K 7/02
(52) U.S. Cl. ..................... 361/810; 361/801; 361/802
(58) Field of Search ................................ 439/567, 548, 439/557, 554; 361/760, 767, 796, 799–803, 810, 816, 818, 807, 809

(56) References Cited

U.S. PATENT DOCUMENTS

| 5,115,375 | A | * | 5/1992 | Garay | ........................ 361/760 |
| 6,175,509 | B1 | * | 1/2001 | Koch | ......................... 361/809 |
| 6,377,475 | B1 | * | 4/2002 | Reis | ............................ 361/818 |
| 6,411,522 | B1 | * | 6/2002 | Frank et al. | ................ 361/800 |
| 6,431,889 | B1 | * | 8/2002 | Olson | ......................... 439/157 |

* cited by examiner

Primary Examiner—David Martin
Assistant Examiner—Thanh S. Phan
(74) Attorney, Agent, or Firm—Foley & Lardner LLP

(57) ABSTRACT

A structure for a circuit board attaching portion includes a circuit board on which an engaged portion are formed and a mounting part in which an engaging claw are formed. The circuit board is attached to the mounting part by engaging the engaging claw with the engaged portion. A catch preventing portion, which prevents the engaging claw from being caught, is formed on the engaged portion. Even when an edge portion of the engaged portion has an acute angle or even when there is a difference in hardness between the circuit board and the mounting part, the catch preventing portion effectively prevents a catch between the engaged portion and the engagement claw from occurring. Therefore, the efficiency of the attaching work can be improved and the circuit board can be prevented from cracking.

9 Claims, 4 Drawing Sheets

STRUCTURE FOR CIRCUIT BOARD ATTACHING PORTION

BACKGROUND OF THE INVENTION

1. Field of the Invention

The present invention relates to a structure for a circuit board attaching portion.

2. Description of the Related Art

An instrument having a speedometer, a tachometer, a fuel gauge, a water temperature gauge, and the like is attached in a vehicle such as an automobile.

Such an instrument has a structure shown in FIG. 4. A dial plate 3 in which a letter/scale portion is formed along an area where each of pointers 2 is swung is attached to a surface of a mounting part 1 such as a case. A circuit board 5 having circuit components such as movements 4 for swinging the pointers 2 is attached to the rear face of the mounting part 1 such as a case.

Engaged portions 7 such as engagement holes 6 or engagement notches are formed in the circuit board 5. Engagement claws 8 protrude from the mounting part 1. As shown in FIGS. 5A to 5C, the engagement claws 8 are engaged with the engaged portions 7, respectively, to attach the circuit board 5 to the mounting part 1.

In FIG. 4, the reference numeral 9 denotes a light guide plate which guides light emitted from a light source (not shown) to the letter/scale portions of the dial plate 3, base portions of the pointers 2, and the like. Reference numeral 10 denotes electrical connecting pins which elongate from the movements 4. Reference numeral 11 denotes solder for electrically connecting the electrical connecting pins 10 to the circuit board 5.

In the structure for the circuit board attaching portion according to the related art, usually, the engaged portions 7 of the circuit board 5 are formed by a punching operation in press working, and hence edge portions have acute angles. Moreover, the mounting part 1 such as a soft case, which is produced by, for example, injection-molding a PP composite material, is different in hardness from the hard circuit board 5, which is formed by stacking an epoxy resin, a paper phenol resin, and the like. Because of these reasons, when the engagement claws 8 are engaged with the engaged portions 7, a catch due to, for example, a bite between the edge portion of the engaged portion 7 and an inclined guide face, which is formed in a tip end of the engagement claws 8 occurs as shown in FIG. 6. This impairs the efficiency of the attaching work. There arises the possibility that, during the attaching work, this catch causes the harder circuit board 5 to crack or whittling to be produced.

SUMMARY OF THE INVENTION

It is an object of the invention to provide a structure for a circuit board attaching portion in which the above-discussed problem can be solved, the efficiency of the attaching work can be improved, and the circuit board 5 can be prevented from cracking.

In order to attain the object, according to a first aspect of the invention, there is provided a structure for a circuit board attaching portion including a circuit board on which an engaged portion are formed and a mounting part in which an engaging claw are formed. The circuit board is attached to the mounting part by engaging the engaging claw with the engaged portion. A catch preventing portion, which prevents the engaging claw from being caught, is formed on a side of a mounting part attached face of the engaged portion.

According to the first aspect of the invention, the catch preventing portion is formed on a side of a mounting part attached face of the engaged portion. Even when an edge portion of the engaged portion has an acute angle or even when there is a difference in hardness between the circuit board and the mounting part, the catch preventing portion effectively prevents a catch between the engaged portion and the engagement claw from occurring. Therefore, the efficiency of the attaching work can be improved and the circuit board can be prevented from cracking.

According to a second aspect of the invention, the catch preventing portion is an edge dulling portion, which is formed on an edge portion of the engaged portion.

According to the second aspect of the invention, since the edge dulling portion is formed as the catch preventing portion on the edge portion of the engaged portion, it is possible to prevent more effectively a catch between the engaged portion and the engagement claw from occurring.

According to a third aspect of the invention, the edge dulling portion is a building up portion, which is formed on the edge portion of the engaged portion.

According to the third aspect of the invention, since the building up portion is formed as the edge dulling portion on the edge portion of the engaged portion, the edge portion of the engaged portion can be dulled so that a catch between the engaged portion and the engagement claw can be prevented more effectively from occurring.

According to a fourth aspect of the invention, the building up portion is solder.

According to the fourth aspect of the invention, since the building up portion is the solder, the edge portion of the engaged portion can be easily dulled so that a catch between the engaged portion and the engagement claw can be effectively prevented from occurring.

According to a fifth aspect of the invention, the solder is disposed on a land, which is formed on the edge portion of the engaged portion.

According to the fifth aspect of the invention, since the solder is disposed on a land, which is formed on the edge portion of the engaged portion, the solder can be effectively disposed.

According to a sixth aspect of the invention the solder is formed concurrently with soldering of a circuit component onto the circuit board.

According to the sixth aspect of the invention, since the solder of the building up portion is formed concurrently with soldering of a circuit component onto the circuit board, it is not required to particularly form the catch preventing portion and hence the production cost can be suppressed.

DETAILED DESCRIPTION OF THE PREFERRED EMBODIMENTS

Hereinafter, a specific embodiment of the invention will be described with reference to an illustrated example.

Figure 1:
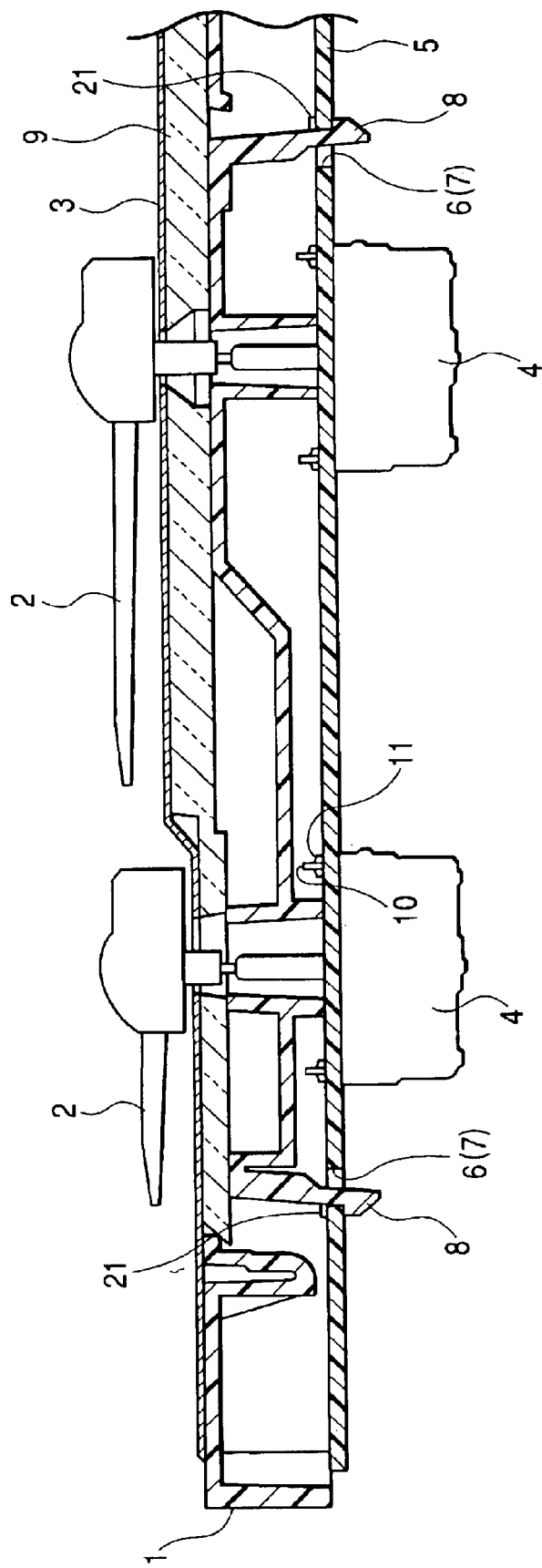
FIG. 1 is a side section view of an embodiment of the invention.
Figure 2:
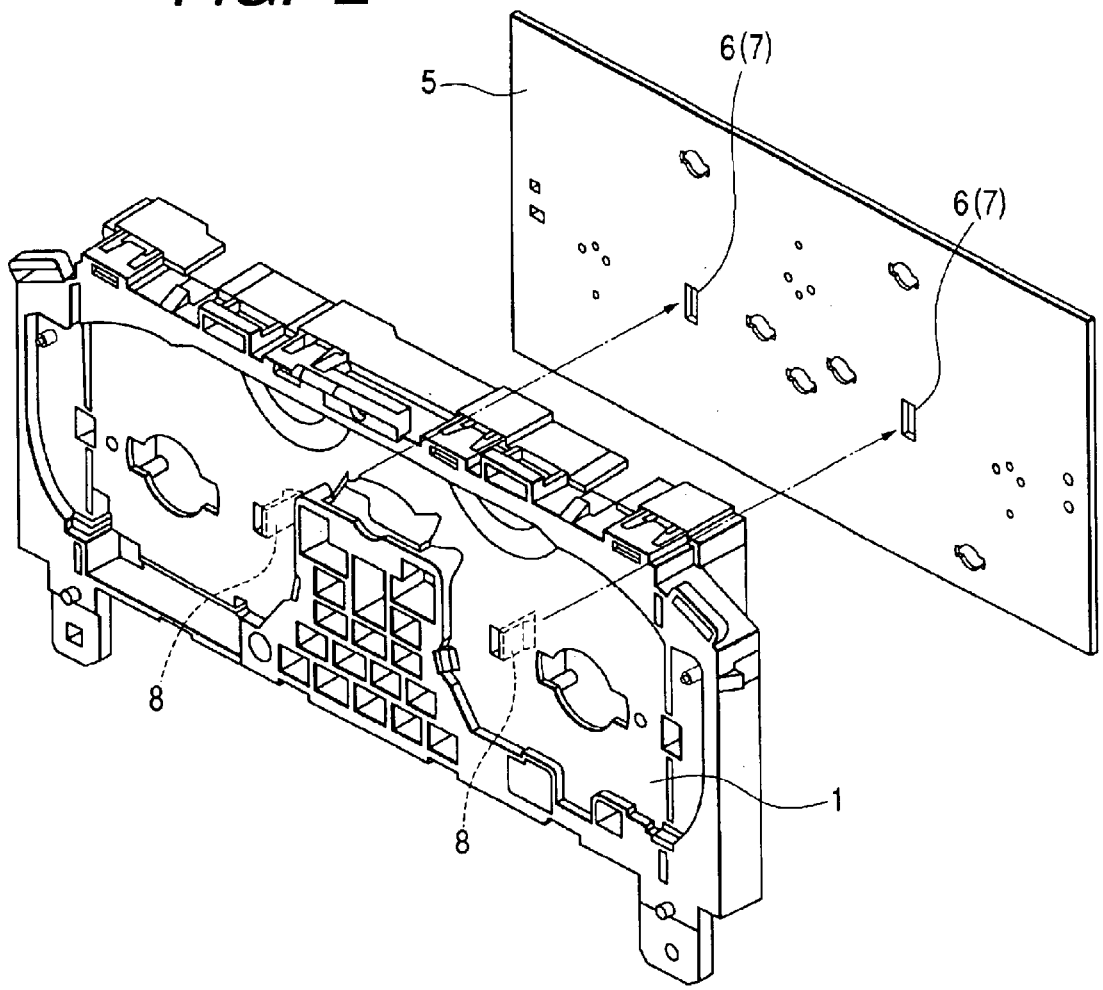
FIG. 2 is a perspective view showing an attaching state of a mounting part and a circuit board.
Figure 3:
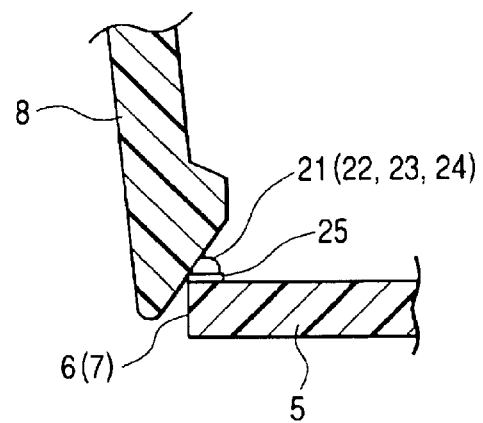
FIG. 3 is an enlarged side view showing main portions of the attaching state of the mounting part and the circuit board in the embodiment.
Figure 4:
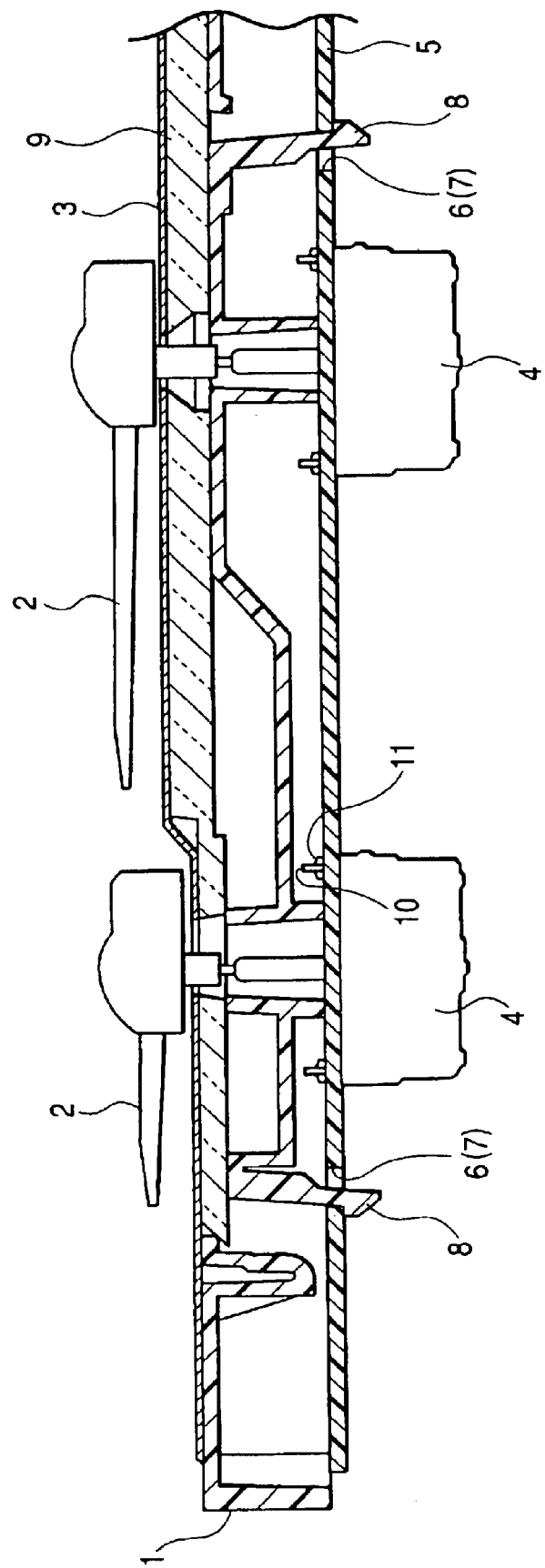
FIG. 4 is a side section view of the related art.
Figure 5A:
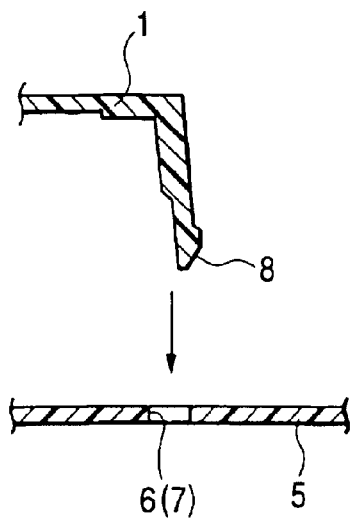
FIGS. 5A to 5C are enlarged side views showing a step of attaching the circuit board to the mounting part.
Figure 5B:
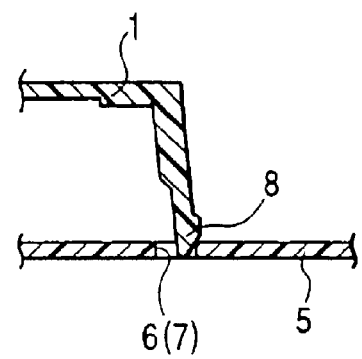
Figure 5C:
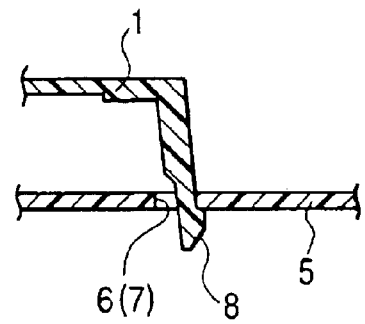
Figure 6:
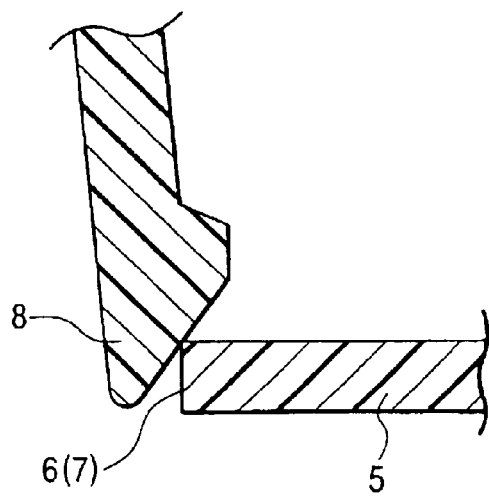
FIG. 6 is an enlarged side view showing main portions of an attaching state of a mounting part and a circuit board in the related art.

FIGS. 1 to 3 show an embodiment of the invention. Parts identical or equivalent to those of the related art are denoted by the same reference numerals.

A configuration of the embodiment first will be described. An instrument having a speedometer, a tachometer, a fuel gauge, a water temperature gauge, and the like is attached in a vehicle such as an automobile.

Such an instrument has a structure shown in FIG. 1. A dial plate 3 in which a letter/scale portion is formed along an area where each of pointers 2 is swung is attached to a surface of a mounting part 1 such as a case. A circuit board 5 having movements 4 for swinging the pointers 2 and electronic control circuit components are attached to the rear face of the mounting part 1 such as a case.

Engaged portions 7 such as engagement holes 6 or engagement notches are formed in the circuit board 5. Engagement claws 8 protrude from the mounting part 1. As shown in FIG. 2, the engagement claws 8 are engaged with the engaged portions 7, respectively, to attach the circuit board 5 to the mounting part 1.

In FIG. 1, the reference numeral 9 denotes a light guide plate which guides light emitted from a light source (not shown) to the letter/scale portions, base portions of the pointers 2, and the like. Reference numeral 10 denotes electrical connecting pins, which elongate from the movements 4. Reference numeral 11 denotes solder for electrically connecting the electrical connecting pins 10 to the circuit board 5.

In the embodiment, as shown in FIG. 3, a catch preventing portion 21 which prevents the engagement claw 8 from being caught is formed on a mounting part-attached face of each of the engaged portions 7.

The catch preventing portion 21 is an edge dulling portion 22 which is formed on an edge portion of the engaged portion 7.

The edge dulling portion 22 may be configured in various manners, and, for example, by chamfering the edge portion of the engaged portion 7. In the embodiment, the unit is configured by forming a building up portion 23 on the edge portion of the engaged portion 7.

The building up portion 23 may be configured in various manners, and, for example, by heaping an adhesive agent, a coating material, or a photoresist which is formed on the surface of the circuit board 5. In the embodiment, the building up portion 23 is configured by solder 24.

A land 25 is formed on the edge portion of the engaged portion 7, and the solder 24 is then disposed on the land 25.

The solder 24 is formed concurrently with soldering of the circuit components onto the circuit board 5.

Next, an effect of the embodiment will be described.

Even when the edge portion of the engaged portion 7 has an acute angle, or even when there is a difference in hardness between the circuit board 5 and the mounting part 1, the formation of the catch preventing portion 21 on the side of the mounting part-attached face of the engaged portion 7 prevents the inclined guide face of the engagement claw 8 from directly contacting with the acute edge of the engaged portions 7 and effectively prevents a catch between the engaged portion 7 and the engagement claw 8 from occurring. Therefore, the efficiency of the attaching work can be improved and the circuit board 5 can be prevented from cracking.

Since the edge dulling portion 22 is formed as the catch preventing portion 21 on the edge portion of the engaged portion 7, it is possible to prevent more effectively a catch between the engaged portion 7 and the engagement claw 8 from occurring.

During the attaching process, moreover, the inclined face of the engagement claw 8 is not whittled by the edge portion of the engaged portion 7. Therefore, it is possible to prevent whittling from being produced.

Since the building up portion 23 is formed as the edge dulling portion 22 on the edge portion of the engaged portion 7, the edge portion of the engaged portion 7 can be dulled. Therefore, a catch between the engaged portion 7 and the engagement claw 8 can be prevented more effectively from occurring.

Since the building up portion 23 is configured by the solder 24, the edge portion of the engaged portion 7 can be easily dulled. Therefore, a catch between the engaged portion 7 and the engagement claw 8 can be prevented more effectively from occurring.

When the solder 24 is disposed on the land 25 which is formed on the edge portion of the engaged portion 7, the solder 24 can be effectively disposed.

Since the solder 24 of the building up portion 23 is formed concurrently with soldering of the circuit components onto the circuit board 5, it is not required to add a special process such as a process of chamfering the edge of the engaged portions 7. Therefore, the production cost can be suppressed.

In the embodiment described above, the engagement holes 6 or engagement notches are formed as the engaged portions 7. It is a matter of course that the outer peripheral edge of the circuit board 5 may be used as the engaged portions 7.

As described above, according to the first aspect of the invention, the catch preventing portion is formed on the side of the mounting part attached face of the engaged portion. Even when the edge portion of the engaged portion has an acute angle or even when there is a difference in hardness between the circuit board and the mounting part, the catch preventing portion effectively prevents a catch between the engaged portion and the engagement claw from occurring. Therefore, the efficiency of the attaching work can be improved and the circuit board can be prevented from cracking.

According to the second aspect of the invention, since the edge dulling portion is formed as the catch preventing portion on the edge portion of the engaged portion, it is possible to prevent more effectively a catch between the engaged portion and the engagement claw from occurring.

According to the third aspect of the invention, since the building up portion is formed as the edge dulling portion on the edge portion of the engaged portion, the edge portion of the engaged portion can be dulled so that a catch between the engaged portion and the engagement claw can be prevented more effectively from occurring.

According to the fourth aspect of the invention, since the building up portion is solder, the edge portion of the engaged portion can be easily dulled so that a catch between the engaged portion and the engagement claw can be effectively prevented from occurring.

According to the fifth aspect of the invention, since the solder is disposed on a land, which is formed on the edge portion of the engaged portion, the solder can be effectively disposed.

According to the sixth aspect of the invention, since the solder of the building up portion is formed concurrently with soldering of a circuit component onto the circuit board, it is not required to particularly form the catch preventing portion. Therefore, it is possible to exert a practically useful effect that the production cost can be suppressed.

What is claimed is:

1. A structure for a circuit board attaching portion comprising:

a circuit board on which an engaged portion is formed; and a mounting part in which an engaging claw is formed;

wherein the circuit board is attached to the mounting part by engaging the engaging claw with the engaged portion, wherein a catch preventing portion, which prevents the engaging claw from being caught, is directly formed as a building up portion on a side of the engaged portion facing the engaging claw, and wherein the engaged portion comprises an engagement hole or an engagement notch and the engaging claw penetrates the engagement hole or engagement notch.

2. The structure according to claim 1, wherein the catch preventing portion is an edge dulling portion, which is formed on an edge portion of the engaged portion facing the engaging claw.

3. The structure according to claim 1, wherein the circuit board and the mounting part are formed of materials having different hardnesses.

4. The structure according to claim 1, wherein the building up portion comprises one of an adhesive agent, a coating material, or a photoresist.

5. The structure according to claim 1, wherein the engaged portion comprises an outer peripheral edge of the circuit board.

6. A structure for a circuit board attaching portion comprising:

a circuit board on which an engaged portion is directly formed; and a mounting part in which an engaging claw is formed, wherein the circuit board is attached to the mounting part by engaging the engaging claw with the engaged portion, wherein a catch preventing portion, which prevents the engaging claw from being caught, is formed on a side of a mounting part attached face of the engaged portion, wherein the catch preventing portion is an edge dulling portion, which is formed on an edge portion of the engaged portion, wherein the edge dulling portion is a building up portion, which is formed on the edge portion of the engaged portion, wherein the building up portion is solder, and wherein the engaged portion comprises an engagement hole or an engagement notch and the engaging claw penetrates the engagement hole or engagement notch.

7. The structure according to claim 6, wherein the solder is disposed on a land, which is formed on the edge portion of the engaged portion.

8. The structure according to claim 6, wherein the solder is formed concurrently with soldering of a circuit component onto the circuit board.

9. The structure according to claim 7, wherein the solder is formed concurrently with soldering of a circuit component onto the circuit board.

* * * * *